US009579697B2

(12) United States Patent
Hsu et al.

(10) Patent No.: US 9,579,697 B2
(45) Date of Patent: Feb. 28, 2017

(54) SYSTEM AND METHOD OF CLEANING FOUP

(71) Applicant: Taiwan Semiconductor Manufacturing Co., Ltd., Hsin-Chu (TW)

(72) Inventors: Jyh-Shiou Hsu, Hsin-Chu (TW); Chi-Ming Yang, Hsinchu (TW); Kuo-Sheng Chuang, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 1019 days.

(21) Appl. No.: 13/706,403

(22) Filed: Dec. 6, 2012

(65) Prior Publication Data
US 2014/0158172 A1 Jun. 12, 2014

(51) Int. Cl.
*B08B 9/46* (2006.01)
*B08B 9/08* (2006.01)
*H01L 21/67* (2006.01)
*H01L 21/673* (2006.01)

(52) U.S. Cl.
CPC .......... *B08B 9/46* (2013.01); *B08B 9/0861* (2013.01); *H01L 21/67051* (2013.01); *H01L 21/67207* (2013.01); *H01L 21/67253* (2013.01); *H01L 21/67393* (2013.01)

(58) Field of Classification Search
CPC ... B08B 9/46; B08B 9/0861; H01L 21/67051; H01L 21/67253; H01L 21/67393; H01L 21/67207
See application file for complete search history.

(56) References Cited

U.S. PATENT DOCUMENTS 6,322,633 B1 11/2001 Bexten et al.
6,412,502 B1 * 7/2002 Bexten ............... B08B 3/12
134/104.1

(Continued)

FOREIGN PATENT DOCUMENTS

CN 102194730 A 9/2011

OTHER PUBLICATIONS

ITRS International Technology Roadmap for Semiconductors, 2011 Edition, Yield Enhancement, 20 pages.
(Continued)

*Primary Examiner* — Michael Barr
*Assistant Examiner* — Benjamin L Osterhout
(74) *Attorney, Agent, or Firm* — Duane Morris LLP

(57) ABSTRACT

A system for cleaning a container such as semiconductor wafer carrier includes a housing, a cleaning unit in the housing, an analyzing unit within the housing, and a vacuum unit within the housing. The cleaning unit comprises a cleaning chamber, and is configured to spray a cleaning medium into the container in the cleaning chamber and dry the container. The analyzing unit is configured to analyze air inside the container coming out of the cleaning chamber, and provide a testing result for each ingredient of possible airborne molecular contamination (AMC) and humidity. The vacuum unit comprises a vacuum chamber configured to apply vacuum onto a container when the testing result for an ingredient is higher than a respective threshold.

16 Claims, 8 Drawing Sheets

(56) References Cited

U.S. PATENT DOCUMENTS

| | | | |
|---|---|---|---|
| 6,922,867 B1* | 8/2005 | Hao | B08B 5/02 15/312.1 |
| 8,012,303 B2 | 9/2011 | Moriya et al. | |
| 2002/0000240 A1* | 1/2002 | Kamikawa | H01L 21/67051 134/57 R |
| 2002/0073576 A1* | 6/2002 | Kamikawa | H01L 21/67051 34/448 |
| 2005/0111935 A1* | 5/2005 | Kim | H01L 21/67017 414/217 |
| 2006/0272169 A1* | 12/2006 | Miyajima | H01L 21/67017 34/211 |
| 2006/0292037 A1* | 12/2006 | Favre | H01L 21/67253 422/68.1 |
| 2007/0062561 A1* | 3/2007 | Koch | G01N 1/2202 134/18 |
| 2009/0241992 A1* | 10/2009 | Yamazawa | B08B 1/00 134/8 |
| 2010/0004785 A1* | 1/2010 | Mochizuki | G05B 19/41865 700/266 |
| 2010/0126531 A1* | 5/2010 | Ku | B08B 3/08 134/26 |
| 2010/0319730 A1* | 12/2010 | Rebstock | H01L 21/67028 134/19 |

OTHER PUBLICATIONS

Geng, H., Semiconductor Manufacturing Handbook—Chapter 32.2—Automated Material Handling System—Principal Components of an AMHS, 2 pages, retrieved from http://beta.globalspec.com/reference/10449/121073/chapter-32-2-automated-material-handling . . . .

Semiconductor Equipment Corp. Products, FOUP Cleaner Fully Automatic FOUP Cleaning Systems,5 pages, retrieved from http://www.semicorp.com/products/FOUPcleaner.html.

FOUP from Wikipedia, 1 page, retrieved from http://en.wikipedia.org/wiki/FOUP.

Mikkelsen, K. et al, "Characterizing FOUPs and evaluation their ability to prevent wafer contamination", 300-MM Imperative, Reprinted from MICRO, Mar. 2001, Copyright 2001 Canon Communications LLC, 6 pages.

* cited by examiner

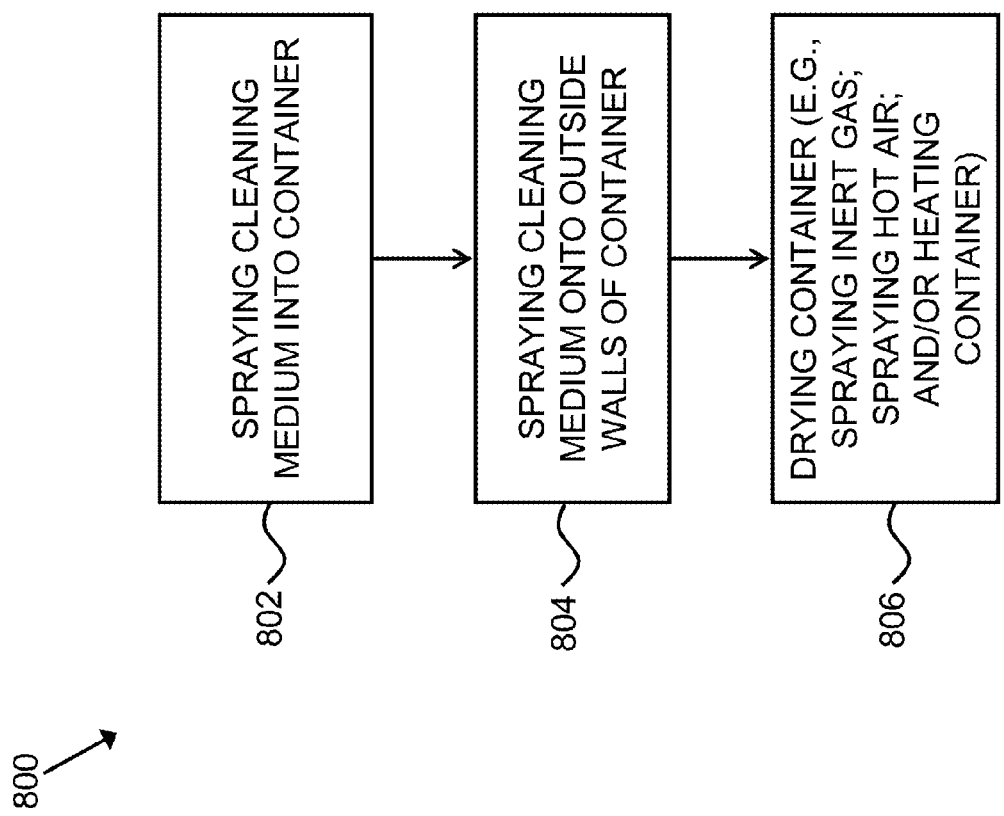

SYSTEM AND METHOD OF CLEANING FOUP

FIELD

This disclosure relates to an apparatus and a process for semiconductors. More particularly, the disclosed subject matter relates to a system and a method of cleaning a container such as a front opening unified pod (FOUP).

BACKGROUND

Multiple wafers are typically stored and transported together in batches by a wafer carrier throughout a semiconductor fabrication facility ("fab") between the loadports of different wafer processing tools or equipment. Such tools generally perform various photolithography, etching, material/film deposition, curing, annealing, inspection, or other processes used in IC chip manufacturing. One such wafer carrier is a front opening unified pod (FOUP) which is a plastic enclosure designed to hold a plurality of wafers ranging from 300 mm to 450 mm sizes in a controlled environment. Typically, each wafer carrier holds approximately 25 wafers. The individual wafers are stacked vertically in the FOUP and stored in a wafer support frame having multiple separate wafer shelves or slots.

BRIEF DESCRIPTION OF THE DRAWINGS

The present disclosure is best understood from the following detailed description when read in conjunction with the accompanying drawings. It is emphasized that, according to common practice, the various features of the drawings are not necessarily to scale. On the contrary, the dimensions of the various features are arbitrarily expanded or reduced for clarity.

Like reference numerals denote like features throughout specification and drawings.

FIG. 8 is a flow chart illustrating a method for cleaning and drying a container such as a FOUP in some embodiments.

DETAILED DESCRIPTION

Figure 1:
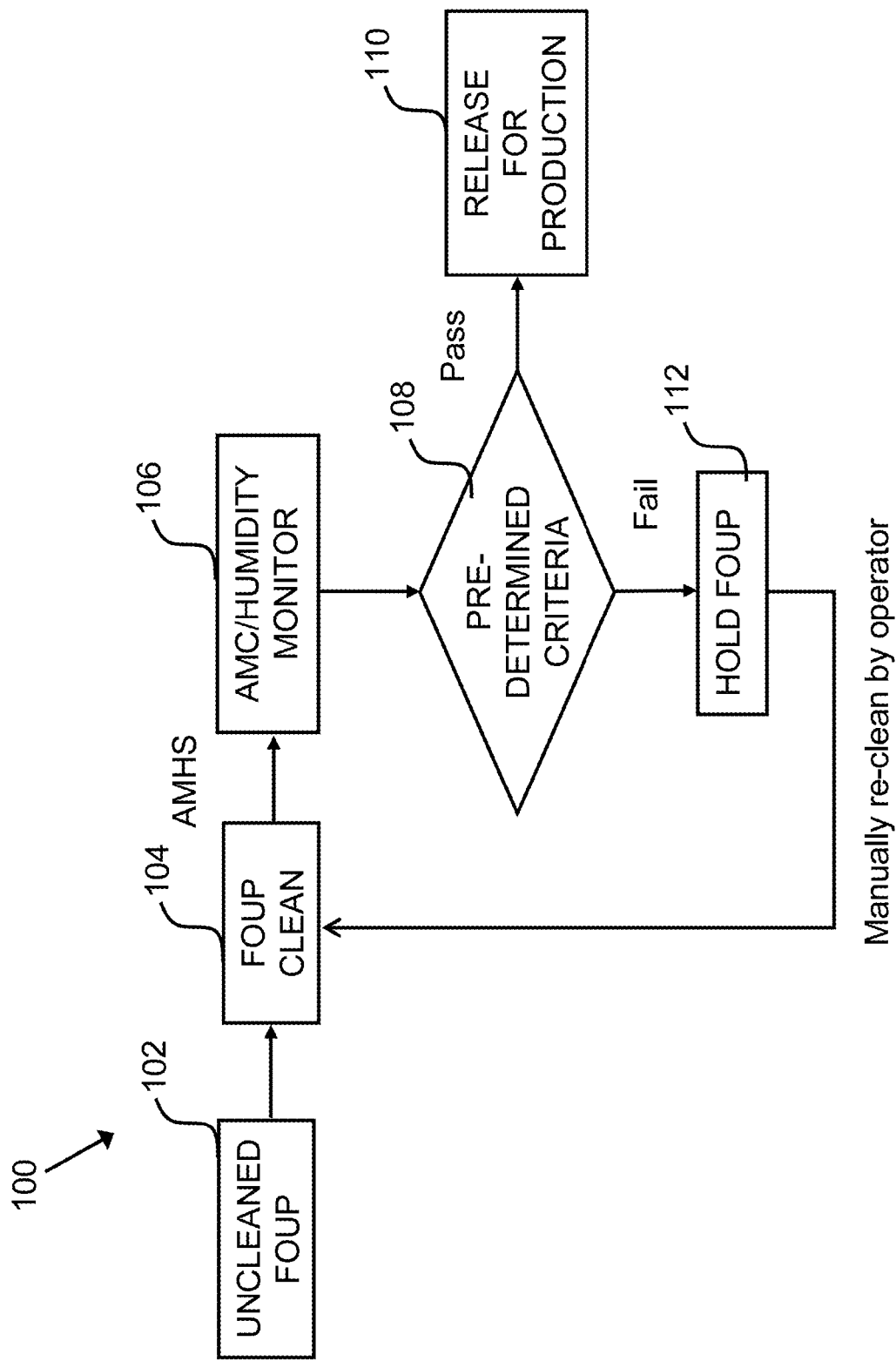
FIG. 1 is a block diagram illustrating a procedure for cleaning a FOUP.

This description of the exemplary embodiments is intended to be read in connection with the accompanying drawings, which are to be considered part of the entire written description. In the description, relative terms such as "lower," "upper," "horizontal," "vertical,", "above," "below," "up," "down," "top" and "bottom" as well as derivative thereof (e.g., "horizontally," "downwardly," "upwardly," etc.) should be construed to refer to the orientation as then described or as shown in the drawing under discussion. These relative terms are for convenience of description and do not require that the apparatus be constructed or operated in a particular orientation. Terms concerning attachments, coupling and the like, such as "connected" and "interconnected," refer to a relationship wherein structures are secured or attached to one another either directly or indirectly through intervening structures, as well as both movable or rigid attachments or relationships, unless expressly described otherwise.

The size of semiconductor wafers has increased to improve throughput and reduce cost per die. For example, in the transition from 300 mm to 450 mm wafer size, the wafer area increases by 125%. Controlling the wafer environment in the ambient space around the wafer (including inside a FOUP) at all times becomes more critical for the more-than-double-sized wafer to avoid any defects. After use, a FOUP may contain airborne molecular contamination (AMC), which can outgas from construction materials in a cleanroom, wafer processing equipment, post-processed wafers and chemicals used in the wafer processing. AMC and other contamination may directly affect wafer processing or react with moisture or other ingredients in the environment to deposit particulate contamination onto a wafer.

The present disclosure provides a system and a method for cleaning a container such as semiconductor wafer carrier. Examples of a container include but are not limited to a FOUP used for carrying 300 mm or 450 mm wafers. After use, a FOUP may contain airborne molecular contamination (AMC) which may affect semiconductor processing or react with moisture to deposit particulate contamination on an internal wall of a FOUP and, possibly, subsequently on a wafer. Therefore, it is desirable to clean a FOUP periodically to mitigate or eliminate any possible contamination.

Referring to FIG. 1, the block diagram 100 illustrates procedures for cleaning a FOUP in accordance with various embodiments of the present invention. An uncleaned FOUP (as shown in block 102), which may comprise AMC/humidity, is sent to a FOUP cleaning station (as shown in block 104). After cleaning, the FOUP can be sent through an automated material handling system (AMHS) to a testing station having an AMC/humidity monitor (as shown in block 106). Compositions and Contents of possible AMC and humidity inside the FOUP are then measured. The testing results are compared against a set of pre-determined criteria (as shown in block 108). If the testing results meet the predetermined criteria, the FOUP can be released for semiconductor processing or production (as shown in block 110). If the testing results do not meet the predetermined criteria, this FOUP will be held for further cleaning (as shown in block 112). This FOUP can be sent back to the cleaning station (block 104). The FOUP can be re-cleaned manually by an operator, or automatically on a cleaning apparatus. After re-cleaning, the FOUP is then moved to a testing station (block 106) until it meets the pre-determined criteria and is released for a semiconductor process in production (block 110). In some cases, these procedures in different stations may result in additional contaminations.

However, the inventors have determined another procedure with higher efficiency in cleaning and handling a wafer carrier such as a FOUP. Therefore, the inventors have determined a system and a method for cleaning a container in accordance with some embodiments described below.

Figure 5:
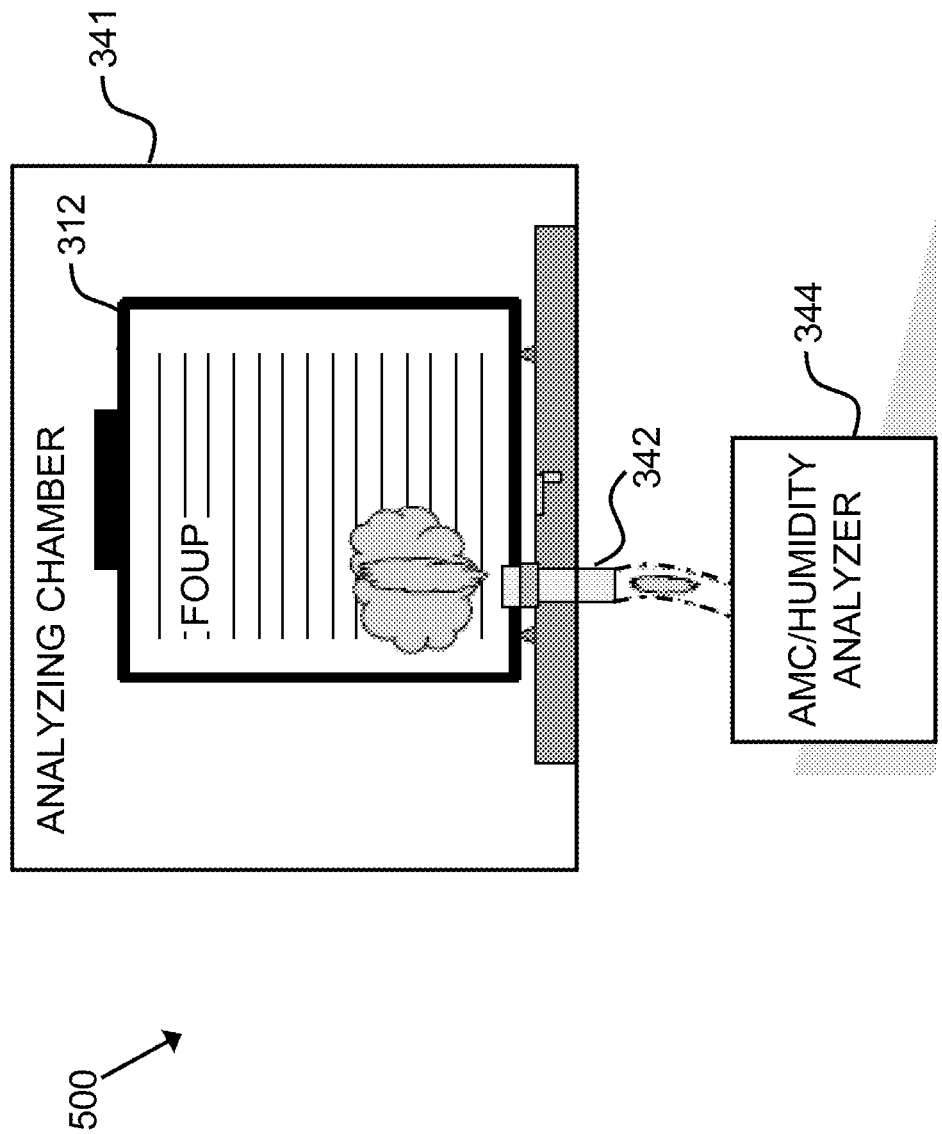
FIG. 5 is a schematic cross-sectional view of an exemplary analyzing unit comprising an analyzing chamber in accordance with some embodiments.
Figure 6:
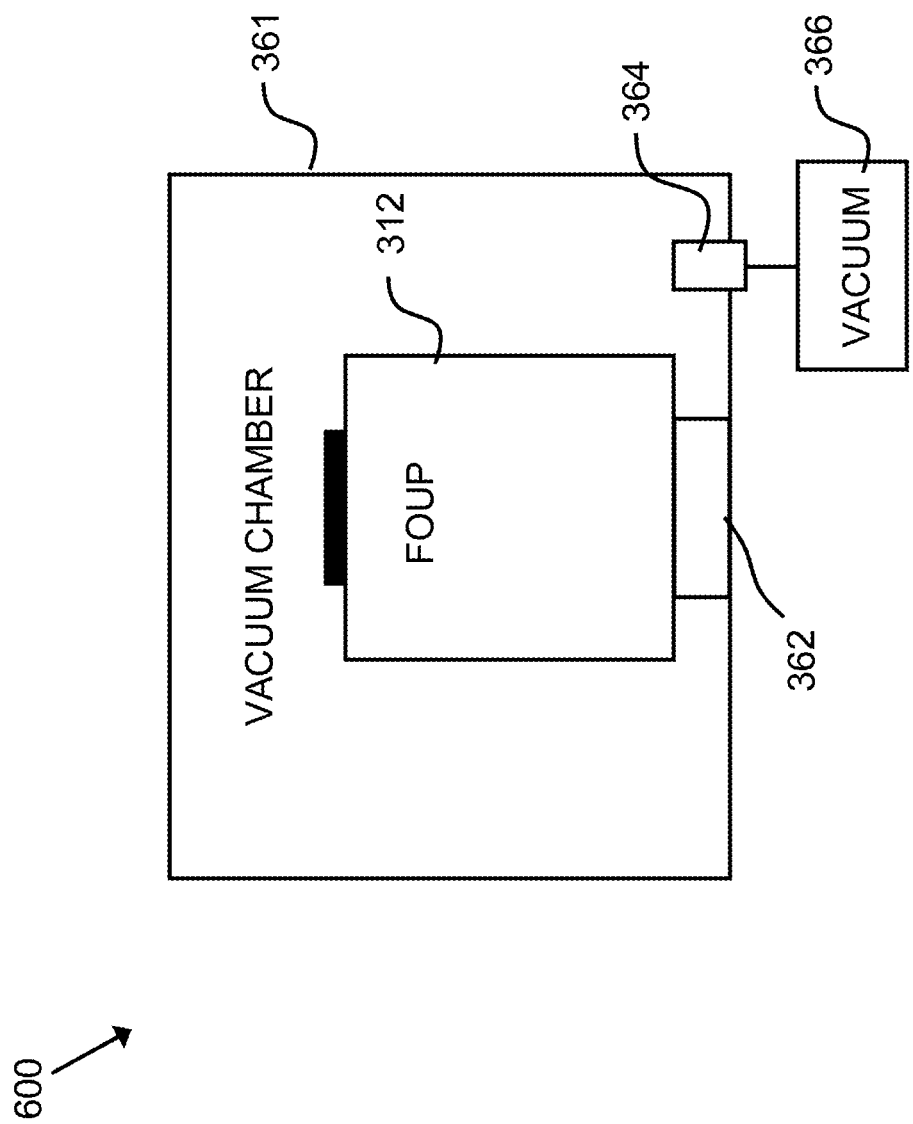
FIG. 6 is a schematic cross-sectional view of an exemplary vacuum unit comprising a vacuum chamber in accordance with some embodiments.
Figure 7:
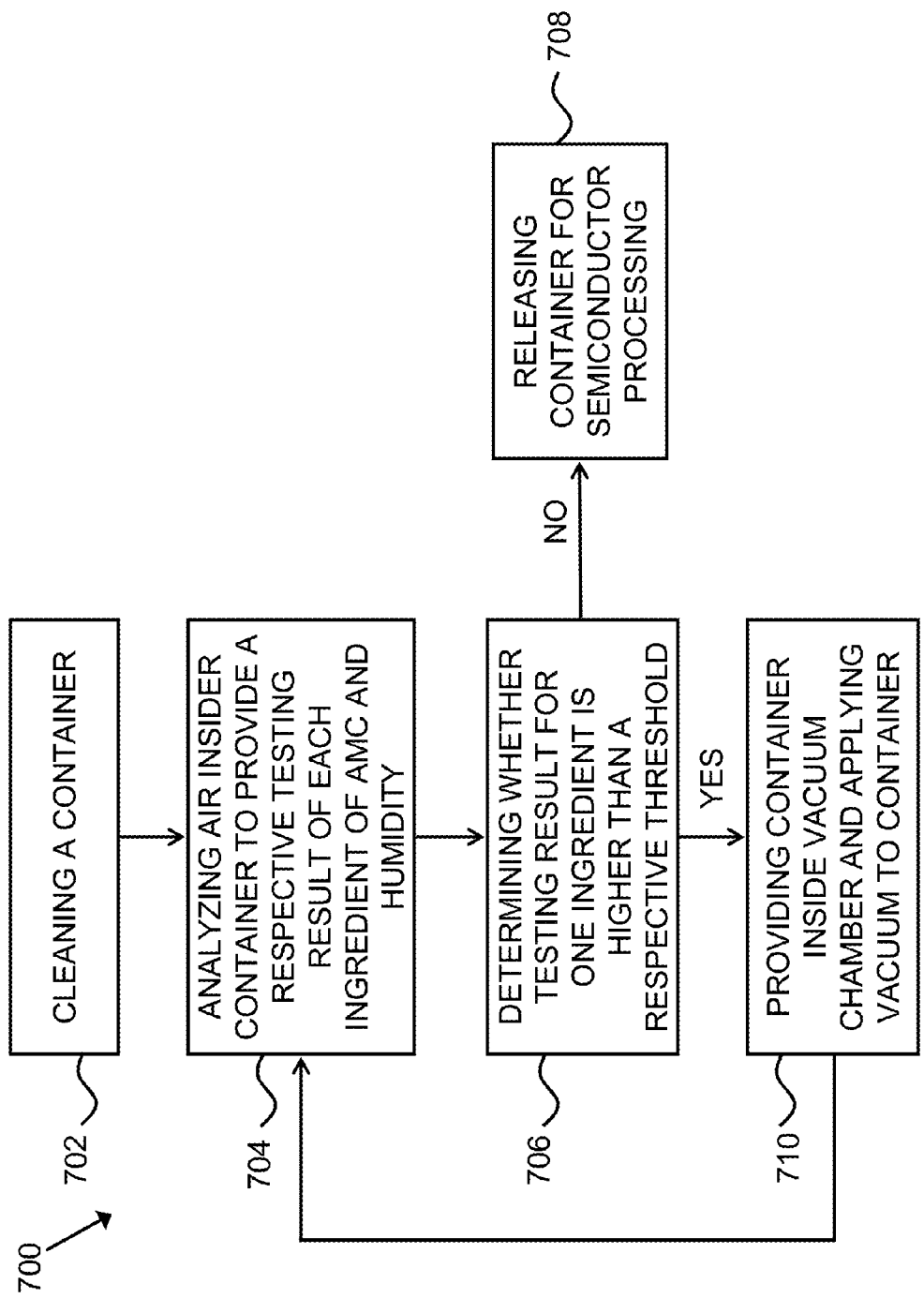
FIG. 7 is a flow chart illustrating a method for cleaning a container such as a FOUP in accordance with some embodiments.

In FIGS. 2-6, like items are indicated by like reference numerals, and for brevity, descriptions of the structure, provided above with reference to the previous figures, are not repeated. The methods described in FIGS. 7-8 are described with reference to the exemplary system or apparatus described in FIGS. 2-6.

Figure 2:
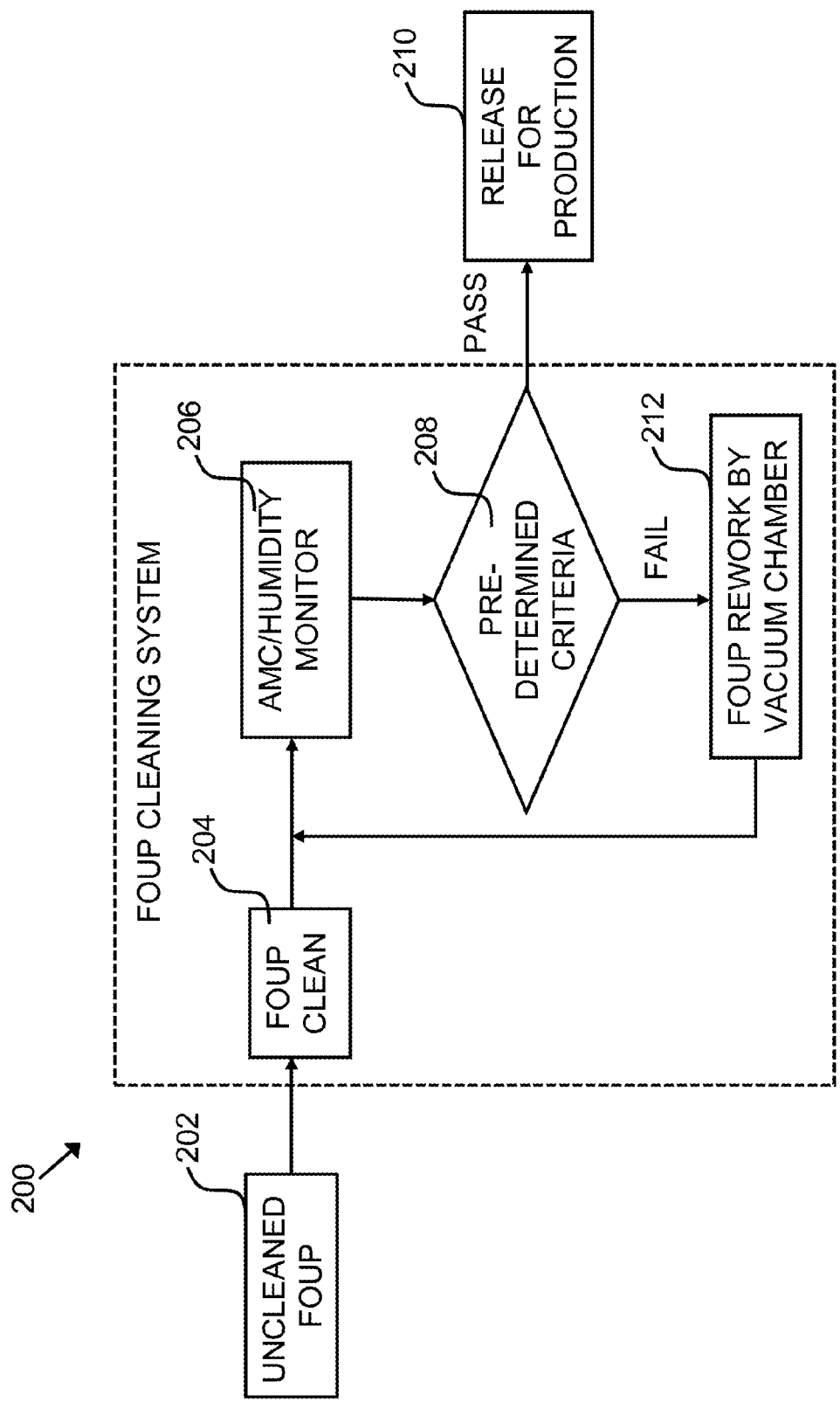
FIG. 2 is a block diagram illustrating a system or an apparatus for cleaning a container such as a FOUP in accordance with some embodiments.
Figure 3:
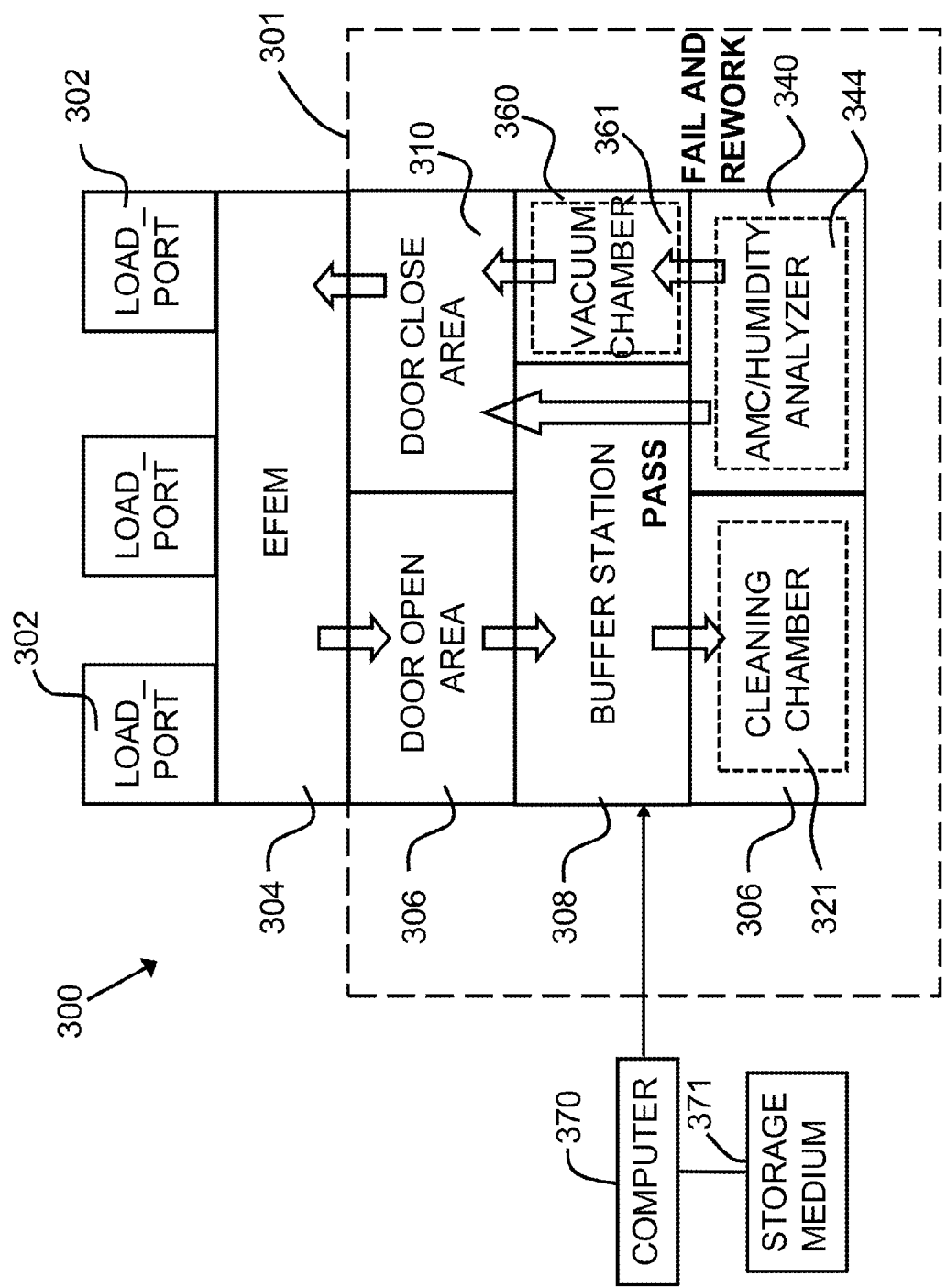
FIG. 3 is a schematic top-down view of an exemplary system for cleaning a container such as a FOUP in accordance with some embodiments.

Referring to FIG. 2, the block diagram 200 illustrates working principle of a system or an apparatus for cleaning a container 312 in accordance with some embodiments. In some embodiments, container 312 is a front opening unified pod (FOUP). FIG. 3 is a schematic top-down view of an exemplary system or apparatus 300 for cleaning a container 312 such as a FOUP in some embodiments. As shown from block 202 to block 204 in FIG. 2, an uncleaned FOUP is moved into a cleaning unit 320 of system 300.

Referring to FIG. 3, in some embodiments, system 300 comprises a housing 301, a cleaning unit 320, an analyzing unit 340, and a vacuum unit 360. Cleaning unit 320, analyzing unit 340 and vacuum unit 360 are within the housing 301.

Figure 4:
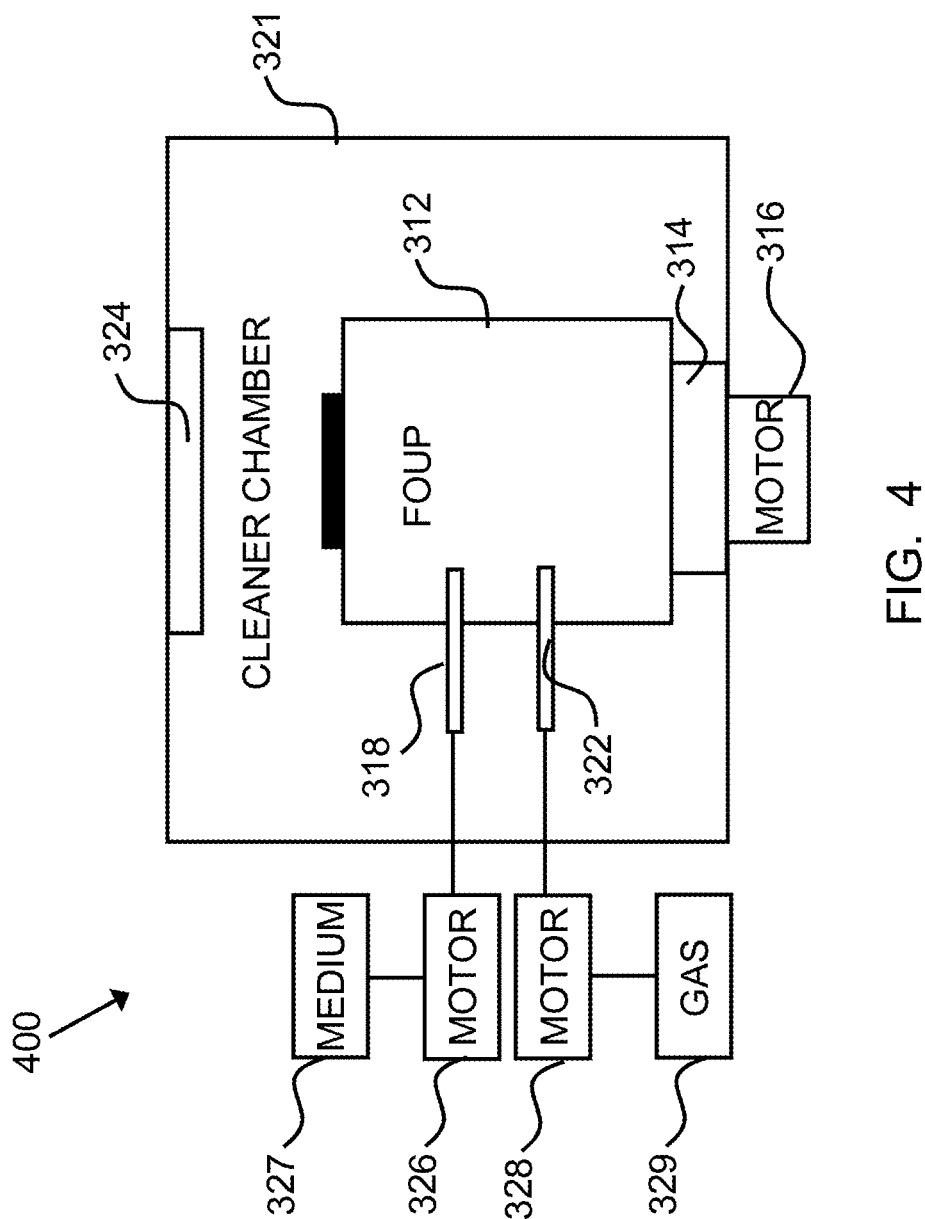
FIG. 4 is a schematic cross-sectional view of an exemplary cleaning unit comprising a cleaning chamber in accordance with some embodiments.

In some embodiments, cleaning unit 320 comprises a cleaning chamber 321, and is configured to spray a cleaning medium 327 into a container 312 in cleaning chamber 321 and dry container 312. FIG. 4 is a schematic cross-sectional view of an exemplary cleaning unit 320 comprising a cleaning chamber 321 in accordance with some embodiments.

As shown in FIG. 4, in some embodiments, cleaning unit 320 comprises at least one nozzle 318, which is configured to spray cleaning medium 327 inside container 312. Container 312 such as a FOUP 312 can have a front opening. The at least one nozzle 318 can be robotically-controlled, and is configured to get into the front opening of container 312 and move around the inside profile of container 312. In some embodiments, the at least one nozzle 318 can be connected with a motor 326 and actuator (not shown) for such movement and spraying as described. Examples of a suitable cleaning medium 327 include, but are not limited to, filtered deionized water or ultra-pure water. In some embodiments, a suitable spray cleaning medium 327 can optionally comprise a surfactant, a solvent or other suitable chemical. Cleaning medium 327 is filtered at 0.1 micron or less, for example at 50 nm, to remove any possible particulate contamination. In some embodiments, the at least one nozzle 318 can also spray cleaning medium 327 around the exterior profile of container 312. In other embodiments, cleaning unit 320 can comprise at least one additional nozzle (not shown) to spray cleaning medium 327 around the exterior profile of container 312. After the spraying as described, cleaning medium 327 from inside and outside the container 312 can be separated in some embodiments, to avoid cross-contamination.

In some embodiments, cleaning unit 320 further comprises at least one nozzle 322 configured to spray a gas 329 inside the container 312. In some embodiments, the at least one nozzle 322 can be connected with a motor 328 and actuator (not shown) for moving along the interior of container 312 and spraying gas 329 as described. Examples of a suitable gas 329 include, but are not limited to, an inert gas such as nitrogen, and hot air. The temperature of the inert gas or air can be in the range of 25° C. to 80° C., for example, 60° C. in some embodiments. In some embodiments, the at least one nozzle 318—configured to spray cleaning medium 327—is the same nozzle as the at least one nozzle 322 configured to spray gas 329. In some embodiments, the at least one nozzle 322 can also spray gas 329 around the exterior profile of container 312.

In some embodiments, cleaning unit 320 can further comprise a heater 324 configured to heat container 312 in cleaning chamber 321. Examples of a temperature of heater 324 can be in the range of 25° C. to 80° C., for example, 60° C. In some embodiments, container 312 can be cooled down to ambient temperature after being heated. In some embodiments, container 312 such as a FOUP disposed over a supporter 314 and optionally rotated during the cleaning and drying steps through a motor 316 connected with supporter 314.

Referring to FIG. 3, analyzing unit 340 within housing 301 is configured to analyze air inside container 312 coming out of cleaning chamber 321, and provide a testing result for each ingredient of possible airborne molecular contamination (AMC) and humidity. As shown from block 204 to block 206 in FIG. 2, after cleaning in cleaning unit 320, each container 312 is moved into the analyzing unit 340, and is subject to testing and monitoring for AMC and humidity inside container 312.

FIG. 5 is a schematic cross-sectional view of an exemplary analyzing unit 340 comprising an analyzing chamber 341 in accordance with some embodiments. As shown in FIG. 5, analyzing unit 340 can comprise an analyzing chamber 341 which is configured to house a container 312, such as a FOUP. Analyzing unit 340 can further comprise an AMC/humidity analyzer 344, and a sample connection port 342 which is configured to collect a certain sample of air inside container 312 and provide the sample to the AMC/humidity analyzer 344. A door or front opening of container 312 is closed during collection of the air sample. In some embodiments, the AMC/humidity analyzer 344 is disposed outside the analyzing chamber 341. Sample connection port 342 goes through a wall of analyzing chamber 341. Examples of a suitable AMC/humidity analyzer 344 include, but are not limited to, a surface acoustic wave (SAW) device and an atmosphere pressure ionized mass spectrometer (APIMS). In some embodiments, an AMC/humidity analyzer 344 can be an instrument disposed inside the analyzing chamber 341 for on-line monitoring.

An AMC/humidity chamber analyzer 344 is used to test and provide a testing result of content of an ingredient of AMC and humidity. Examples of an ingredient include but not limited to acids, amines, HF gas, $SO_2$, volatile organic compounds (VOC) and relative humidity (RH). For each ingredient, there is a threshold as a predetermined criterion in a set of predetermined specifications. As shown in FIG. 2 (from block 208 to block 210), if a respective result of each ingredient meet the respective predetermined criterion for that ingredient, (i.e., the respective content of each ingredient is not higher than the respective threshold), the container 312 can be released for semiconductor processing in the production. In some embodiments, a processor such as a computer 370 can be connected with the AMC/humidity analyzer 344. The predetermined criterion or specification is stored in processor 370. Processor 370 is configured to compare the testing result against the predetermined criterion or specification, and then provide instructions with respect to container 312. As shown in FIG. 2 (from block 208 to block 212), if a testing result is higher than the respective predetermined threshold, container 312 is moved into vacuum unit 360. Container 312 is released for production only after a testing result is not higher than the respective predetermined threshold, as shown from block 212 to block 206 and block 208 in FIG. 2.

Referring to FIGS. 2 and 3, vacuum unit 360 comprises a vacuum chamber 361 configured to apply vacuum onto a container 312 when the testing result for an ingredient is higher than a respective threshold. FIG. 6 is a schematic cross-sectional view 600 of an exemplary vacuum unit 360 comprising a vacuum chamber 361 in accordance with some embodiments. As shown in FIG. 6, vacuum unit 360 can also be a port 364 on a wall of vacuum chamber 361, and port 364 is connected with a vacuum pump 366 outside vacuum chamber 361. As shown in FIG. 6, in some embodiments, vacuum unit 360 is configured to house container 312 inside vacuum chamber 361, and apply vacuum to both inside and outside container 312. A door or a front opening of container 312 is kept open during the vacuum process. In other embodiments, port 364 can be directly connected with container 312. Vacuum is only applied inside container 312.

Referring back to FIG. 3, in some embodiments, system 300 further comprises at least one loading port 302 configured to provide a container 312, an equipment front end module (EFEM) 304 connected to the at least one load port 312, a door opening area 306 connected with the EFEM 304, and a door closing area 310 connected with the EFEM 304.

In some embodiments, system 300 further comprises a buffer station 308 between door opening area 306 and cleaning chamber 321 of cleaning unit 320. Buffer station 308 is configured to move container 312 into cleaning chamber 321. In some embodiments, buffer station 308 is partially coupled between analyzing unit 340 and door closing area 310. Buffer station 308 is configured to move container 312 from analyzing unit 340 to door closing area 310, if the testing result for an ingredient is not higher than a respective threshold.

FIG. 7 is a flow chart illustrating a method 700 for cleaning a container 312 such as a FOUP in accordance with some embodiments. At step 702, a container 312 is cleaned inside a cleaning chamber 321 of a cleaning unit 320 within the housing 301, using a cleaning medium 327, as described in FIGS. 2 and 3. FIG. 8 is a flow chart illustrating an exemplary method 800, as an example of a detailed procedure for step 702, for cleaning and drying a container in some embodiments. At step 802 of FIG. 8, a cleaning medium 327 is sprayed into container 312. For example, cleaning medium 327 can be sprayed through at least one robot-controlled nozzle 318 from an open door or front opening of container 312. Examples of a suitable cleaning medium 327 include, but are not limited to, filtered deionized water or ultra-pure water, optionally comprising a surfactant, a solvent or other suitable chemical.

In some embodiments, the step 702 of cleaning a container 312 inside a cleaning chamber 321 can optionally comprise spraying cleaning medium 327 onto outside walls of the container 312. Referring to FIG. 8, step 804 is an optional step. At step 804, cleaning medium 327 can be sprayed onto outside walls of container 312. Cleaning medium 327 after being sprayed inside and outside container 312 can be stored separately to avoid cross-contamination.

At step of 806, in some embodiments, the step of drying container 312 comprises at least one of spraying an inert gas 329 such as nitrogen into container 312, spraying hot air into container 312, and heating container 312 at a raised temperature. Any combination of one or more of these possible steps can be used. Examples of a temperature of hot air or a raised temperature during heating can be in the range of 25° C. to 80° C., for example, 60° C. in some embodiments. In some embodiments, container 312 can be cooled down to ambient temperature after heating.

Referring back to FIG. 7, at step 704, after container 312 is cleaned; air inside the container 312 is analyzed in an analyzing unit 340, as described in FIGS. 3 and 5. In this method, the analyzing unit 340 and the cleaning unit 320 are in the same housing 301, and are connected to each other. At step 704, a respective testing result for each ingredient of possible airborne molecular contamination (AMC) and humidity is also provided.

At step 706, the method determines whether the testing result for one of the ingredients is higher than a respective threshold. In some embodiments, the respective thresholds are included in a set of predetermined specifications. For example, in some embodiments, the specifications comprise: an acid content of less than 15 parts per billion by volume (ppbv), a HF content of less than 20 ppbv; a SO2 content of less than 1.0 ppbv, an amine content of less than 20 ppbv, a volatile organic content of less than 1000 ppbv, and a relative humidity level of less than 55%.

As described in FIG. 3, if the testing result for one of the ingredients is not higher than the respective threshold thereof, container 312 is released for semiconductor processing at step 708. If the testing result for one of the ingredients is higher than the respective threshold thereof, container 312 is then provided inside a vacuum chamber 344 of a vacuum unit 340 within the same housing 301 at step 710, and vacuum is applied onto container 312 to make each ingredient of AMC and humidity lower than the respective threshold. In some embodiments, container 312 is inside vacuum chamber 321, and vacuum is applied to both inside and outside container 312 at step 710.

Some embodiments of the method comprise a processor implemented process in which the predetermined criteria or specification is stored in a non-transitory, computer readable storage medium of the processor 370 (shown in FIG. 3) such as a computer, controller, or embedded processor. The computer 370 is specially programmed to perform the steps shown in FIGS. 7 and 8. Through a computer implemented program, the processor compares the testing results against the predetermined criteria or specifications, and then provide instructions with respect to container 312 according to the procedures of FIGS. 7 and 8.

The present disclosure provides a system and a method for cleaning a container such as semiconductor wafer carrier. In some embodiments, the system comprises a housing, a cleaning unit in the housing, an analyzing unit within the housing, and a vacuum unit within the housing. The cleaning unit comprises a cleaning chamber, and is configured to spray a cleaning medium into the container in the cleaning chamber and dry the container. The analyzing unit is configured to analyze air inside the container coming out of the cleaning chamber, and provide a testing result for each ingredient of possible airborne molecular contamination (AMC) and humidity. The vacuum unit comprises a vacuum chamber configured to apply vacuum onto a container when the testing result for an ingredient is higher than a respective threshold. In some embodiments, the container is a front opening unified pod (FOUP). In some embodiments, the vacuum unit is configured to house the container inside the vacuum chamber, and apply vacuum to both inside and outside the container.

In some embodiments, the system further comprises at least one loading port configured to provide a container, an equipment front end module (EFEM) connected to the at least one load port, a door opening area connected with the EFEM, and a door closing area connected with the EFEM. In some embodiments, the system further comprises a buffer station between the door opening area and the cleaning chamber of the cleaning unit. The buffer station is configured to move the container into the cleaning chamber. In some embodiments, the buffer station is partially coupled between the analyzing unit and the door closing area. The buffer station is configured to move the container from the analyzing unit to the door closing area, if the testing result for an ingredient is not higher than a respective threshold.

In some embodiments, the cleaning unit comprises at least one nozzle configured to spray the cleaning medium inside the container. In some embodiments, the cleaning unit further comprises at least one nozzle configured to spray a gas inside the container. In some embodiments, the at least one nozzle configured to spray the cleaning medium is the same as the at least one nozzle configured to spray the gas. In some embodiments, the cleaning unit further comprises a heater configured to heat the container in the cleaning chamber.

In some embodiments, the present disclosure provides an apparatus for cleaning FOUP 312. The apparatus comprises a housing, a cleaning unit in the housing, an analyzing unit in the housing, and a vacuum unit in the housing. The cleaning unit comprises a cleaning chamber configured to spray a cleaning medium into a container in the cleaning chamber and dry the container. The analyzing unit, which is connected with the cleaning unit, is configured to analyze air inside the container from the cleaning chamber, and provide a testing result for each ingredient of possible AMC and humidity. The vacuum unit comprises a vacuum chamber connected with the analyzing unit. The vacuum unit is configured to apply vacuum onto a container inside the vacuum chamber when the testing result for one of the ingredients is higher than a respective threshold. In some embodiments, the cleaning unit comprises at least one nozzle configured to spray the cleaning medium inside the container. The cleaning unit can further comprise at least one nozzle configured to spray a gas inside the container. In some embodiments, the at least one nozzle to spray a gas is the same nozzle used for spraying the cleaning medium. In some embodiments, the apparatus further comprises at least one loading port configured to provide a container, an equipment front end module (EFEM) connected to the at least one load port, a door opening area connected with the EFEM, and a door closing area connected with the EFEM. In some embodiments, the apparatus further comprises a buffer station between the door opening area and the cleaning chamber of the cleaning unit, and is partially coupled between the analyzing unit and the door closing area. The buffer station is configured to move the container into the cleaning chamber. The buffer station is also configured to move the container from the analyzing unit to the door closing area, if the testing result for an ingredient is not higher than a respective threshold.

In another aspect, the present disclosure also provides a method of cleaning a container. The method comprises the following steps: a container is cleaned inside a cleaning chamber of a cleaning unit. After the container is cleaned, air inside the container is analyzed in an analyzing unit, which is connected with the cleaning unit. A respective testing result for each ingredient of possible airborne molecular contamination (AMC) and humidity is provided. Whether the testing result for one of the ingredients is higher than a respective threshold is then determined. If the testing result for one of the ingredients is not higher than the respective threshold thereof, the container is released for semiconductor processing. If the testing result for one of the ingredients is higher than the respective threshold thereof, the container is then provided inside a vacuum chamber of a vacuum unit, and vacuum is applied onto the container to make each ingredient of AMC and humidity lower than the respective threshold.

In some embodiments, the respective thresholds are included in a set of predetermined specifications. The specifications comprising: an acid content of less than 15 parts per billion by volume (ppbv), a HF content of less than 20 ppbv, a SO2 content of less than 1.0 ppbv, an amine content of less than 20 ppbv, a volatile organic content of less than 1000 ppbv, and a relative humidity level of less than 55%. In some embodiments, the container is inside the vacuum chamber, and vacuum is applied to both inside and outside the container. The step of cleaning a container inside a cleaning chamber can comprise spraying a cleaning medium into the container, and drying the container.

In some embodiments, the step of cleaning a container inside a cleaning chamber further comprises spraying the cleaning medium onto outside walls of the container. In some embodiments, the step of drying the container comprises at least one of spraying an inert gas into the container, spraying hot air into the container, and heating the container at a raised temperature.

The methods and system described herein may be at least partially embodied in the form of computer-implemented processes and apparatus for practicing those processes. The disclosed methods may also be at least partially embodied in the form of tangible, non-transient machine readable storage media encoded with computer program code. The media may include, for example, RAMs, ROMs, CD-ROMs, DVD-ROMs, BD-ROMs, hard disk drives, flash memories, or any other non-transient machine-readable storage medium, or any combination of these mediums, wherein, when the computer program code is loaded into and executed by a computer, the computer becomes an apparatus for practicing the method. The methods may also be at least partially embodied in the form of a computer into which computer program code is loaded and/or executed, such that, the computer becomes an apparatus for practicing the methods. When implemented on a general-purpose processor, the computer program code segments configure the processor to create specific logic circuits. The methods may alternatively be at least partially embodied in a digital signal processor formed of application specific integrated circuits for performing the methods.

Although the subject matter has been described in terms of exemplary embodiments, it is not limited thereto. Rather, the appended claims should be construed broadly, to include other variants and embodiments, which may be made by those skilled in the art.

What is claimed is:

1. A system comprising:
a housing;
a cleaning unit in the housing, the cleaning unit comprising a cleaning chamber therein, configured to spray a cleaning medium into a container in the cleaning chamber and dry the container;
an analyzing unit within the housing, the analyzing unit configured to analyze air inside the container coming out of the cleaning chamber, and provide a testing result for each ingredient of a possible airborne molecular contaminant (AMC) and humidity;
a vacuum unit within the housing, the vacuum unit comprising a vacuum chamber configured to apply vacuum onto a container only when the testing result for an ingredient is higher than a respective threshold;
at least one loading port configured to provide said container;

an equipment front end module (EFEM) connected to the at least one loading port;

a door opening area connected with the EFEM;

a door closing area connected with the EFEM; and a buffer station between the door opening area and the cleaning chamber of the cleaning unit, and partially coupled between the analyzing unit and the door closing area, wherein the buffer station is configured to move the container into the cleaning chamber, and also configured to move the container from the analyzing unit to the door closing area, if the testing result for an ingredient is not higher than a respective threshold.

2. The system of claim 1, wherein the container is a front opening unified pod (FOUP).

3. The system of claim 1, wherein the vacuum unit is configured to house the container inside the vacuum chamber, and apply vacuum to both inside and outside the container.

4. The system of claim 1, wherein the cleaning unit comprises at least one nozzle configured to spray the cleaning medium inside the container.

5. The system of claim 4, wherein the cleaning unit further comprises at least one nozzle configured to spray a gas inside the container.

6. The system of claim 5, wherein the at least one nozzle configured to spray the cleaning medium is the same as the at least one nozzle configured to spray the gas.

7. The system of claim 4, wherein the cleaning unit further comprises a heater configured to heat the container in the cleaning chamber.

8. An apparatus for cleaning a front opening unified pod (FOUP), comprising:

a housing;

a cleaning unit in the housing, the cleaning unit comprising a cleaning chamber configured to spray a cleaning medium into a container in the cleaning chamber and dry the container;

an analyzing unit in the housing, the analyzing unit connected with the cleaning unit, and configured to analyze air inside the container from the cleaning chamber, and provide a testing result for each ingredient of a possible airborne molecular contaminant (AMC) and humidity;

a vacuum unit in the housing, the vacuum unit comprising a vacuum chamber connected with the analyzing unit, and configured to apply vacuum onto a container inside the vacuum chamber only when the testing result for one of the ingredients is higher than a respective threshold;

at least one loading port configured to provide said container;

an equipment front end module (EFEM) connected to the at least one loading port;

a door opening area connected with the EFEM;

a door closing area connected with the EFEM; and a buffer station between the door opening area and the cleaning chamber of the cleaning unit, and partially coupled between the analyzing unit and the door closing area, wherein the buffer station is configured to move the container into the cleaning chamber, and also configured to move the container from the analyzing unit to the door closing area, if the testing result for an ingredient is not higher than a respective threshold.

9. The apparatus of claim 8, wherein the cleaning unit comprises at least one nozzle configured to spray the cleaning medium inside the container.

10. The apparatus of claim 8, wherein the cleaning unit further comprises at least one nozzle configured to spray a gas inside the container.

11. A method of cleaning a container using the system of claim 1, comprising:

cleaning the container inside the cleaning chamber of the cleaning unit;

analyzing air inside the container in the analyzing unit connected with the cleaning unit after cleaning the container, to provide a respective testing result for each ingredient of possible airborne molecular contamination (AMC) and humidity; and determining whether the testing result for one of the ingredients is higher than a respective threshold, wherein if the testing result for one of the ingredients is not higher than the respective threshold thereof, then the container is released for semiconductor processing;

if the testing result for one of the ingredients is higher than the respective threshold thereof, then the container is provided inside a vacuum chamber of a vacuum unit, and vacuum is applied onto the container to make each ingredient of AMC and humidity lower than the respective threshold.

12. The method of claim 11, wherein the respective thresholds are included in a set of predetermined specifications comprising:

an acid content of less than 15 parts per billion by volume (ppbv);

a HF content of less than 20 ppbv;

a $SO_2$ content of less than 1.0 ppbv;

an amine content of less than 20 ppbv;

a volatile organic content of less than 1000 ppbv; and a relative humidity level of less than 55%.

13. The method of claim 11, wherein the container is inside the vacuum chamber, and vacuum is applied to both inside and outside the container.

14. The method of claim 11, wherein the step of cleaning a container inside a cleaning chamber comprises :

spraying a cleaning medium into the container; and drying the container.

15. The method of claim 14, wherein cleaning a container inside a cleaning chamber further comprises: spraying the cleaning medium onto outside walls of the container.

16. The method of claim 14, wherein the step of drying the container comprises at least one of spraying an inert gas into the container; spraying hot air into the container; and heating the container at a raised temperature.

* * * * *